United States Patent
Horn

(10) Patent No.: US 7,629,893 B2
(45) Date of Patent: Dec. 8, 2009

(54) ARRANGEMENT FOR MONITORING PATCH FIELDS AT DISTRIBUTION POINTS IN DATA NETWORKS USING READER COILS TO DETECT AND COMMUNICATE WITH TRANSPONDERS

(75) Inventor: Thomas Horn, Langenstein (DE)

(73) Assignee: Data-Complex GmbH, Halberstadt (DE)

( * ) Notice: Subject to any disclaimer, the term of this patent is extended or adjusted under 35 U.S.C. 154(b) by 286 days.

(21) Appl. No.: 11/618,602

(22) Filed: Dec. 29, 2006

(65) Prior Publication Data
US 2007/0197086 A1 Aug. 23, 2007

Related U.S. Application Data

(63) Continuation of application No. PCT/EP2005/009749, filed on Sep. 10, 2005.

(30) Foreign Application Priority Data
Oct. 28, 2004 (DE) .................. 10 2004 052 502

(51) Int. Cl.
G08B 21/00 (2006.01)
(52) U.S. Cl. .................. 340/687; 340/572.1; 439/489
(58) Field of Classification Search .............. 340/572.1, 340/10.1, 687, 686.1; 439/488, 489, 490
See application file for complete search history.

(56) References Cited

U.S. PATENT DOCUMENTS

| | | | | |
|---|---|---|---|---|
| 6,784,802 B1 * | 8/2004 | Stanescu | ............... | 340/687 |
| 7,306,489 B2 * | 12/2007 | Werthman et al. | ..... | 439/620.01 |
| 7,436,310 B2 * | 10/2008 | Flaster et al. | ............ | 340/572.8 |

FOREIGN PATENT DOCUMENTS

| | | |
|---|---|---|
| DE | 102 44 304 B3 | 3/2004 |
| EP | 0 575 100 A | 12/1993 |
| WO | WO 2004/044599 A2 | 5/2004 |

OTHER PUBLICATIONS

International Search Report for PCT/EP2005/009749, 2 pgs. (Dec. 19, 2005).

* cited by examiner

*Primary Examiner*—Jeffery Hofsass
(74) *Attorney, Agent, or Firm*—Blakely, Sokoloff, Taylor & Zafman LLP

(57) ABSTRACT

An arrangement for monitoring patch fields at distribution points in data networks comprises patch cables which can be plugged by means of plugs into connectors in the patch fields. Each of the two plugs of each patch cable is provided with a transponder. A device is arranged before or in the proximity of one of the patch fields with its connectors. The device is equipped with readers and reader coils. The readers are in data communication with an evaluation unit. The device comprises a plurality of reader coils, the number of which exceeds the number of connectors in the patch field. The reader coils can be independently driven.

4 Claims, 3 Drawing Sheets

ARRANGEMENT FOR MONITORING PATCH FIELDS AT DISTRIBUTION POINTS IN DATA NETWORKS USING READER COILS TO DETECT AND COMMUNICATE WITH TRANSPONDERS

CROSS-REFERENCE TO RELATED APPLICATIONS

This is a continuation of prior PCT Patent Application No. PCT/EP2005/09749, filed on Sep. 10, 2005, which claims priority from German Patent Application No. 10 2004 052 502.1, filed on Oct. 28, 2004.

BACKGROUND OF THE INVENTION

Field of the Invention

The invention relates to an arrangement for monitoring patch panels at distributor points in data networks, with patch cables, which can be inserted into connections in patch panels by means of plugs, wherein each of the two plugs of each patch cable is provided with a transponder, the arrangement comprising a device arranged before or in the proximity of one of the patch fields with its connectors, wherein the device is equipped with readers and reader coils, the readers being in data communication with an evaluation unit.

Data networks serve, inter alia, to provide data links to a relatively large number of computers, e.g. PCs or work stations, etc., or the staff sitting there, i.e. the users of the data network. The users at the work stations are thus provided with individual services, e.g. with data services or also telecommunication services. In order to achieve this, the data networks have central distributor points, mostly distributor cabinets. Patch panels are provided in the distributor points. These patch panels have ports, i.e. connections. From the ports of these patch panels data cables route e.g. in a star pattern to data connections at the work stations.

There are also active devices located in the distributor cabinets or distributor points besides the patch panels. These active devices to serve to distribute the data, telephone signals or other applications.

The connection of e.g. the active devices to the patch fields (often called patch panels) is achieved with patch cables. These patch cables have a plug at each end. This plug can be inserted into a port or connection on a patch panel. The patch cables are e.g. 8-wired, flexible and e.g. about 0.5 m to 5 m in long. In the case of copper cables, the plugs are generally so-called RJ45 plugs; optical fibers are ready-made with various different plugs.

To now supply a PC/work station with the desired services or to make these services available thereto, the active device must be connected accordingly to the corresponding port on the patch field of patch panel. If for example, a user needs a telephone connection as well as a data link, then the telephone system and a data switch system are made available for him for use by connecting the corresponding ports to the active device.

In the case of changes to services, relocations, transfers or other reorganization measures, it may become necessary to make changes to these connections at the distributors. In this case, "patch rearrangement" must be conducted. Thus, patch cables must be re-plugged in keeping with the services required from now on.

A series of problems arise as a result of this. A plurality of patch cables cover the individual patch panels and also become entwined with one another. Connections that are no longer required still remain patched in some instances. Thus, the clarity of overview in the case of medium and large installations necessarily decreases drastically in some cases. These problems result in errors and time losses in conducting re-patching operations. This in turn leads to an increase in work time for the responsible administrator, as well as for the users, until the services by reworking are truly available. The possibility of damages to the devices or even the completely unintended outage of services as a result of incorrect patching should not be excluded.

Moreover, in companies with dispersed branch offices, it is also desirable to have a remote monitoring an/or control system. In this case, the remote stations should be monitored and possibly controlled centrally through the administrator.

Arrangements for monitoring patch panels at distributor points in data networks are proposed in, for example, EP 0 575 100 B1, U.S. Pat. No. 6,784,802 and DE 102 44 304 B3.

Arrangements in accordance with DE 104 44 304 B3 comprise patch cables, which can be inserted into connections in the patch panels by means of plugs. The patch cables are provided with a plug at each of their ends. Each plug is provided with a transponder.

The connections in the patch panels are each equipped with a reader coil and a reader, the readers being in data communication with an evaluation unit.

With such arrangements, patch panels in telephone systems, security systems, control systems, Switches, Hubs, and other active devices as well as passive systems such as distribution panels (Patchpanels) in the optical fiber and copper field can be accordingly served.

These panels and devices are fabricated by various different manufactures and can be very differently designed. Therefore, for retrofitting already existing patch panels with reader coils, each patch panels has to be provided mechanically with a reader and each connection of a patch panel has to be provided with a reader coil. It is also already proposed in an embodiment in the DE 102 44 304 B3 to arrange the reader coils in covers and to respectively fix these covers to the patch panels later. In this case, at first, the production of such a cover is required for each different device.

Despite the technically already very viable and reliable arrangements according to the DE 102 44 304 B3 there is a desire to have less expensive arrangements.

It is an object of the invention to propose a type compliant arrangement which can be fabricated with less effort.

SUMMARY OF THE INVENTION

This object is solved by the type compliant arrangement in that the device is provided with a plurality of reader coils, the number of which exceeds the number of connections in the patch field and the reader coils can each be driven independently from the other reader coils by a reader electronics comprising one or more readers.

The readers are thus not precisely assigned to a single connection or port in the patch field, and mounted in its vicinity, respectively. Instead, the readers are arranged in the additional device. This device comprises a plurality of reader coils which can exceed the number of ports significantly. Thus, more reader coils are arranged on this device than actually required for the purpose. The can hence be mounted significantly more densely to each other.

As the reader elements each have a directional characteristic the magnetical field which these coils build up can be directly directed to a position where a transponder is present, or can be present, respectively. These are positions which each correspond to a connection or port, as there—at these positions—a plug carrying such a transponder is to be inserted.

Thus, the directional characteristic can be used to address exactly these positions and to read out only that transponder which is at or in a plug which is exactly opposite or, in any case, near the respective coil of the reader.

Due to the plurality of provided reader coils, at least one coil of a reader is located above or near to a port. This correctly or preferably positioned reader coil can be driven by an electronics to make use of the directional characteristic. The correct adjustment is hence separated from the mechanic arrangement of a reader coil on a patch field, or close to a port, respectively, and is relocated in the electronics which drives the reader coils provided with a directional characteristic.

A relatively large number of existing coils is not used thereby. However, these coils or readers do not interfere with the operability of the whole arrangement.

Thus, now, one single device having reader coils arranged on it can be used for a large number of possible patch fields respectively. For example, this device can be mounted in the way of a cover adjacent to the patch field and is driven by the electronics such that exactly one reader coil is directed to a position where a transponder can be situated. The reader electronics can then determine on the one hand if a transponder is actually present there, i.e. if there is a plug inserted at all, and on the other hand the transponder actually inserted there can be read out.

The electronics is then respectively adjusted to one type of a patch field. Naturally, this is significantly less laborious then to design respectively different arrangements of reader coils or to attach each of these separately. The thereby possible mass and serial production of standardized devices with readers and reader coils is significantly less costly than the additional expenses which arise due to reader coils not used in the concrete single case.

The device has preferably the shape of a plate and then carries the reader coils on one plate side.

In a further preferred embodiment the device having the shape of a plate is equipped with reader coils on both sides. Then, for example, it can be attached between two patch panels, and can then read out the transponders situated above and below the device, respectively.

For the rest, the whole arrangement and functionality can remain unchanged compared to the design of the DE 102 44 304 B3. Thus the readers are in data communication with an evaluation unit again, which also can be combined with the electronics driving the respective single reader coils.

The device having in particular the shape of a plate is mounted in the way of a cover. Thereby a cover is not to be understood in that the device covers the patch field as the plugs are not inserted through this device, but are merely situated adjacent to the device similar to a cover. The device detects the transponders at the respective plugs and reads out the data contained in the transponders or in the opposite direction writes data into these and respectively informs the evaluation unit, which may also be referred to as master.

For a better optical detection it is preferred to provide each reader coil of the device with an optical indicator, preferably with a light emitting diode (LED). By such indication by means of an illuminant at the device information can be communicated to the user. Thus, the possible practical actions can be communicated to him by means of these optical indicators, for example, an indication of the connections to be changed. Also errors can be indicated in that way. The evaluation unit or another electronics also drives these optical indicators or illuminants.

A part of the electronics or evaluation unit, for example, a control unit at the cover, may know if and what kind of a patch field or device it drives. By means of this information, it can then automatically drive the reader coils, in fact, in designated form exactly those which respectively are situated opposite or proximate to a port or connection. The not required reader coils are not used and are suitably maintained in an off state.

The arrangement according to the invention allows to utilize one and the same device in the way of a standardized cover for different types of panels and devices having patch fields, thus to fabricate only one type of such a device, with which different arrangements may be built, and different devices may be driven.

A further advantage is that, by means of the potential highly precise prefabrication, also patch fields may be handled which require the plugs to be inserted in ports situated very close to each other, so that the respective transponders in the plugs are also situated very closely to each other.

BRIEF DESCRIPTION OF THE DRAWINGS

In the following, three embodiments of the invention are described in detail.

the following figures show.

DETAILED DESCRIPTION OF THE DRAWINGS

Figure 1:
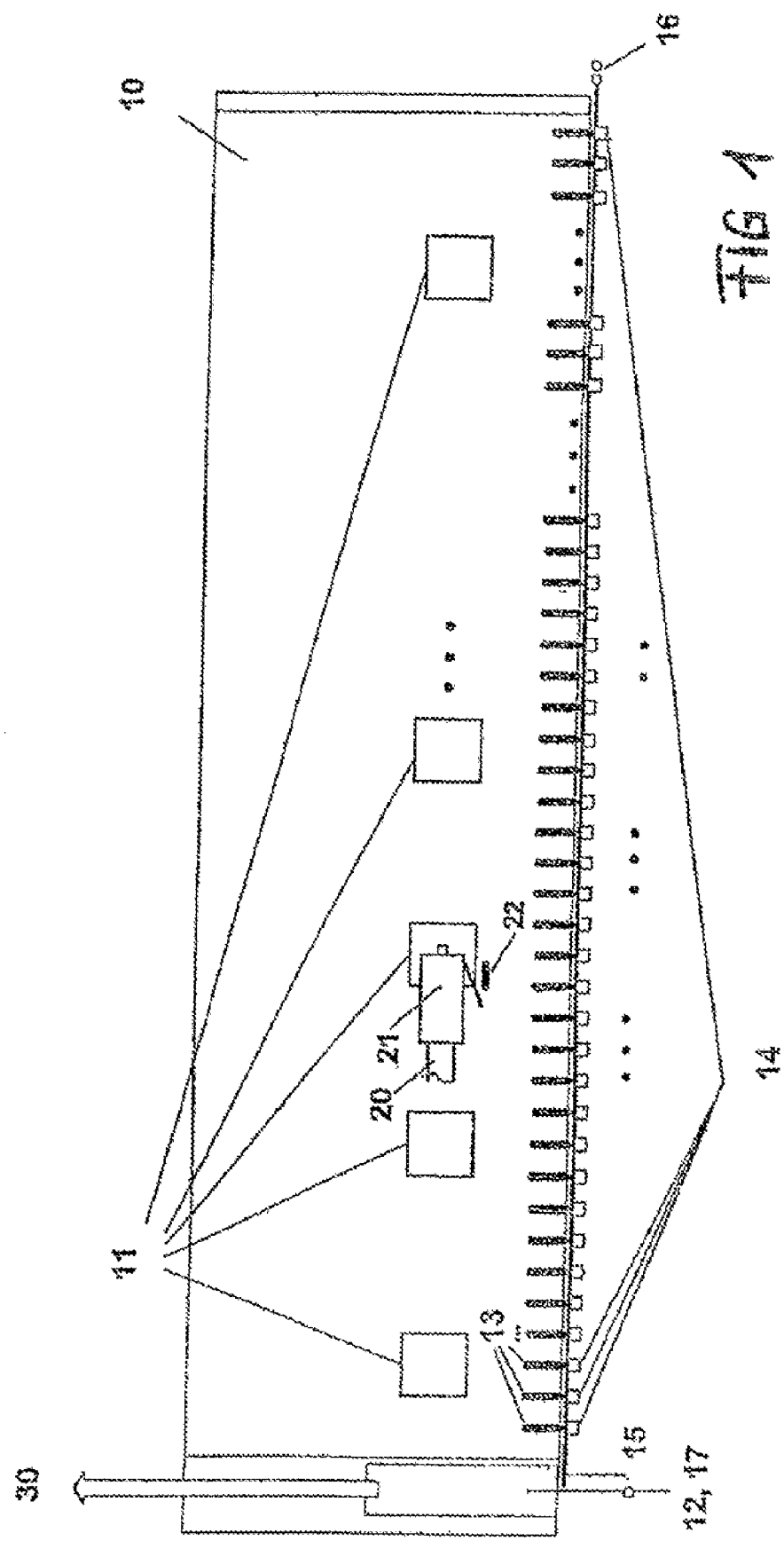
FIG. 1; a schematic drawing of a first embodiment of an arrangement according to the invention.

In FIG. 1, a preferred embodiment of such an arrangement according to the invention is schematically shown. There can be seen a patch field 10 with a plurality of connections 11, the so-called ports. In FIG. 1, five ones thereof are to be seen. These connections 11 allow to insert patch cables 20, and plugs 21, respectively, which are situated at the end of such patch cables 20. For reasons of simplicity, only one patch cable 20 with a plug 21 inserted in one of the connections 11 is indicated in FIG. 1.

The patch cables 20 serve to supply multiple patch fields 10 amongst themselves or with specific service devices such as telephone connections. A patch cable 20 has two ends, each of which is fitted with a plug 21. A transponder 22 is located in the plug 21 or, where fitted subsequently, on the plug 21 of the patch cable 20. The transponder 22 has a coil as well as an electronic circuit, but is kept very small over all and has sufficient space on or in the plug 21 without any problem. On original manufacture the transponder 22 would be injection molded with the plug 21 or in the plastic around the plug 21, but in the case of retrofit of already existing patch cables 20 with plugs 21, an attachment to the outside is possible without any problem.

In the drawing of FIG. 1, the patch field 10 is approximately coplanar with the sheet. A device 15 is situated perpendicular to the plane of the sheet, which is fixed by means of a mechanical latching device 16 adjacent to the patch field 10. This device 15 has the shape of a plate, so that it is shown in the drawing as a line.

Readers 12 with reader coils 13 are situated on the device 15. These are depicted here in a periodic arrangement and equally spaced.

This allows that exactly one reader coil 13 is assigned to a particular connection 11. The reader coil 13 is having a directional characteristic is exactly directed to the connection 11, and a position in its vicinity, respectively, as discussed in the following.

If a plug 21 having a transponder 22 attached to it or in it is situated in that connection 11 to which the reader coil 13 is directed information located on the transponder 22 can be read out by means of a reader electronics 17.

The evaluation of the reader electronics 17 is carried out by forwarding this information to an evaluation unit 30, for example, an electronic device and a corresponding software, possibly with a micro controller interposed.

The evaluation unit 30 can stand at another, possibly also far removed, location to allow remote monitoring.

In the drawing, an optical indicator 14 is assigned to each reader coil 13, for example, a light emitting diode (LED) serving to indicate errors or other evaluations.

Figure 2:
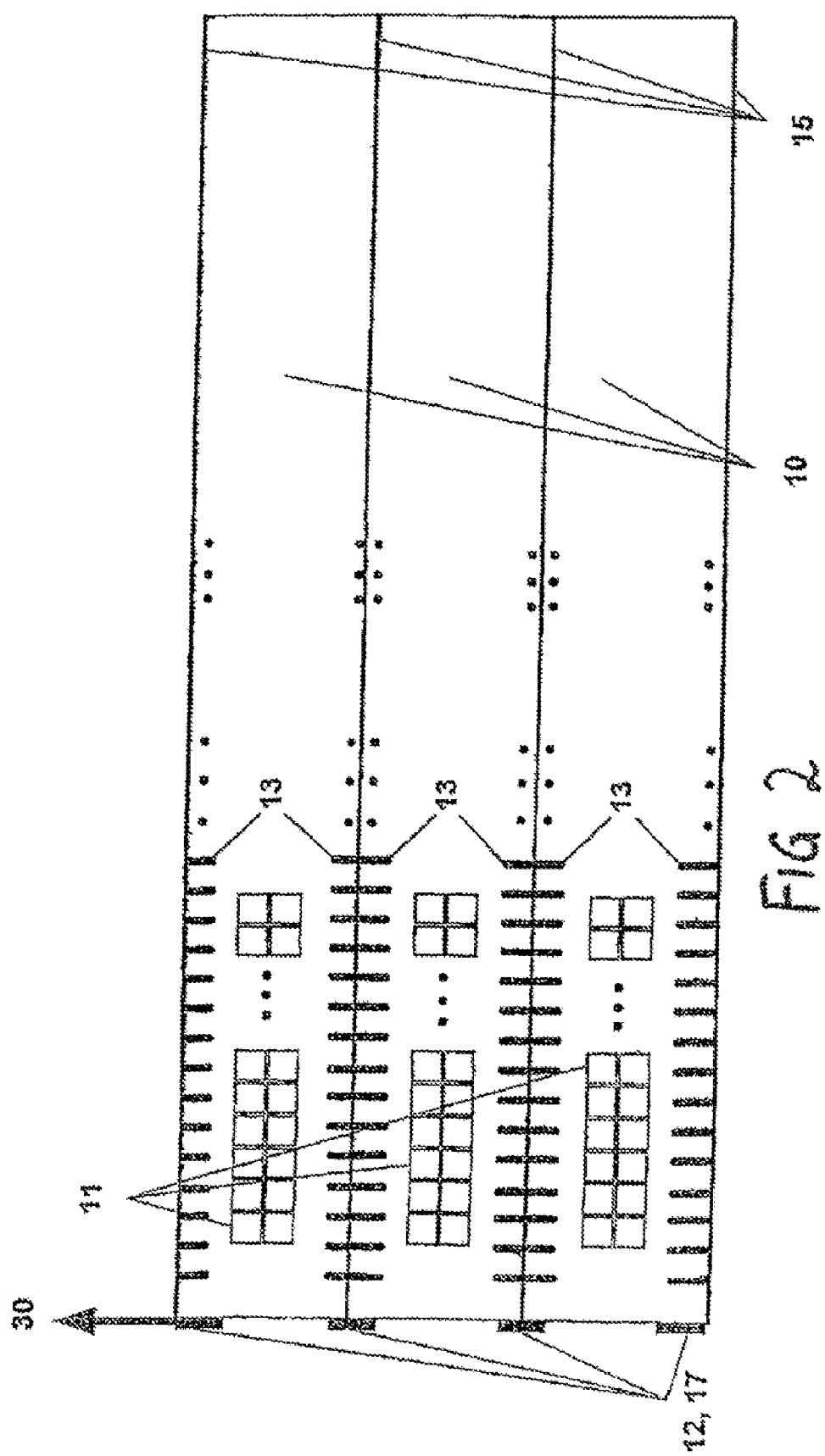
FIG. 2; a schematic a drawing of a second embodiment of an arrangement according to the invention.

In FIG. 2, it is schematically shown, that a device 15 also can be provided with readers 12 and reader coils 13 on both sides, in particular to also suitably operate connections 11 which are situated in rows above each other or next to each other. FIG. 2 is also shows that several if such devices 15 can be utilized for a patch field 10, if this is considered reasonable or necessary because of the dimensions of the patch field 10.

Figure 3:
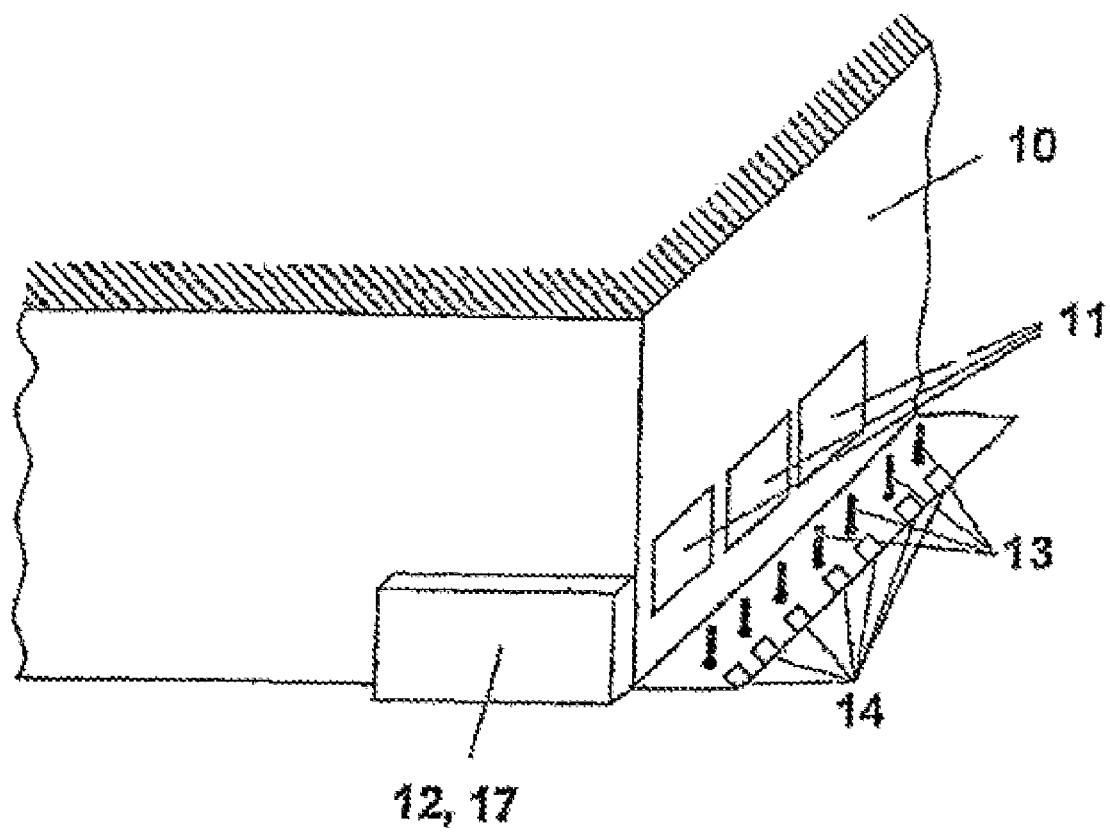
FIG. 3; a perspectively different schematic drawing of the first embodiment of an arrangement according to the invention.

FIG. 3, it is indicated in a schematical perspective view, how an arrangement will be observed by the user. A device can be seen which has approximately the shape of a box. On its side showing to the right a patch field 10 having connections 11 is located. A plate-shaped device 15 is arranged perpendicularly to the side with the patch field 10. Reader coils 13 having directional characteristics are located on the device 15 on the top side here. The control electronics 17 having at least one reader 12 allows to address each single reader coil 13 and to address the reader coils 13 being most proximate to respective connections 11.

Also here, the optical indicators 14 can be seen, each of which is assigned to a respective reader coil 13 and can emit light signals.

LIST OF REFERENCE NUMERALS

10 Patch Field
11 Connection or port
12 Reader
13 Reader coil
14 Optical indicator
15 Device
16 Mechanical latching device
17 Reader electronics
20 Patch cable
21 Plug of the patch cable
22 Transponder on or in the plug
30 Evaluation unit

What is claimed:

1. Arrangement for monitoring patch fields (10) at distribution points in data networks, comprising:
   patch cables (20) which are insertable by use of plugs (21) into connections (11) in the patch fields (10),
   wherein both plugs (21) of each patch cable (20) are each provided with a transponder (22);
   a device (15) which is arranged in front of or in the proximity of one of the patch fields (10) with its connections,
   wherein the device (15) is provided with readers (12) having reader coils (13),
   wherein the readers (12) are in data communication with an evaluation unit (30),
   characterized in that,
   the device (15) is provided with a plurality of reader coils (13), the number of which exceeds the number of connections (11) in the patch field (10), and
   the reader coils (13) are each controllable independently from the other reader coils (13) by a read electronic (17) comprising one or more readers (12).

2. The arrangement according to claim 1, characterized in that each reader coil (13) of the device (15) is provided with a optical indicator for corresponding connections (11), preferably light emitting diodes (LED) (14).

3. The arrangement according to claim 1, characterized in that the device (15) is plate-shaped and is arranged at or adjacent to the patch fields (10), similar to a cover.

4. The arrangement according to claim 3, characterized in that the plate-shaped device (15) can be provided with or is providable with reader coils (13) on both plate sides.

* * * * *